United States Patent
Suzuki et al.

(10) Patent No.: US 11,282,672 B2
(45) Date of Patent: Mar. 22, 2022

(54) CHARGED PARTICLE BEAM APPARATUS AND SAMPLE PROCESSING OBSERVATION METHOD

(71) Applicant: HITACHI HIGH-TECH SCIENCE CORPORATION, Tokyo (JP)

(72) Inventors: Hidekazu Suzuki, Tokyo (JP); Tatsuya Asahata, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 360 days.

(21) Appl. No.: 16/573,668

(22) Filed: Sep. 17, 2019

(65) Prior Publication Data
US 2020/0126755 A1    Apr. 23, 2020

(30) Foreign Application Priority Data
Oct. 18, 2018  (JP) .............................. JP2018-196666

(51) Int. Cl.
*H01J 37/28*   (2006.01)
*H01J 37/21*   (2006.01)
*H01J 37/12*   (2006.01)

(52) U.S. Cl.
CPC .............. *H01J 37/28* (2013.01); *H01J 37/12* (2013.01); *H01J 37/21* (2013.01); *H01J 2237/31749* (2013.01)

(58) Field of Classification Search
CPC .. H01J 37/12; H01J 37/21; H01J 37/28; H01J 37/256; H01J 37/285; H01J 37/305; H01J 37/222
See application file for complete search history.

(56) References Cited

U.S. PATENT DOCUMENTS 7,829,870 B2 * 11/2010 Frosien ............... H01J 37/3056
250/492.1
2016/0247662 A1 * 8/2016 Fujii ..................... H01J 37/305

FOREIGN PATENT DOCUMENTS

JP         2010232195 A     10/2010

* cited by examiner

*Primary Examiner* — David E Smith
*Assistant Examiner* — Hsien C Tsai
(74) *Attorney, Agent, or Firm* — Holland & Hart LLP

(57) ABSTRACT

Disclosed are a charged particle beam apparatus and a sample processing observation method, the method including: a sample piece formation process in which a sample is irradiated with a focused ion beam such that a sample piece is cut out from the sample; a cross-section processing process in which the sample piece support holds the sample piece and a cross section thereof is irradiated with the ion beam to process the cross section; a sample piece approach movement process in which the sample piece support holds the sample piece and the sample piece is moved to a position that is closer to an electron beam column than an intersection point of beam optical axes of the ion beam and an electron beam is; and a SEM image acquisition process in which the cross section is irradiated with the electron beam to acquire the SEM image of the cross section.

10 Claims, 12 Drawing Sheets

CHARGED PARTICLE BEAM APPARATUS AND SAMPLE PROCESSING OBSERVATION METHOD

CROSS REFERENCE TO RELATED APPLICATION(S)

This application claims the benefit of Japanese Patent Application No. 2018-196666, filed Oct. 18, 2018, which is hereby incorporated by reference in its entirety into this application.

BACKGROUND OF THE INVENTION

1. Technical Field

The present invention relates to a charged particle beam apparatus for performing processing and observation on a sample by using a charged particle beam, and to a sample processing observation method.

2. Description of the Related Art

For example, as a method of interpreting an internal structure of a sample for a semiconductor device, and the like, or of performing three-dimensional observation thereon, a method of observing cross-section processing (for example, refer to Patent Document 1) is well known. The method includes: by using a composite charged particle beam device having a focused ion beam (FIB) column and an electron beam (EB) column, performing cross-section forming processing with a focused ion beam (FIB) and performing observation on the cross section with a scanning electron microscope (SEM).

As the method of observing cross-section processing, known is a method of constructing a three-dimensional image by repeating the cross section forming processing with the FIB and the cross-section observation with the SEM. In this method, from a reconstructed three-dimensional stereoscopic image, a stereoscopic shape of a target sample may be interpreted in detail in various directions. Particularly, this method has an advantage that no other methods have, wherein the advantage is that it is possible to perform observation with high resolution regardless of the thickness of a sample.

On the other hand, the SEM has a limit in observation with high magnification (high resolution) in principle, and acquired information is also limited to around the surface of the sample. Due to this, for high-resolution observation with high magnification, known is an observation method using a transmission electron microscope (TEM) that causes electrons to pass through a sample processed into the form of a thin film.

Document of Related Art (Patent Document 1) Japanese Patent Application Publication No. 2010-232195

SUMMARY OF THE INVENTION

In order to perform cross-section processing on a sample with high precision by using a composite charged particle beam apparatus, it is necessary to acquire a high-resolution SEM image. In order to acquire a high-resolution SEM image, it is preferable that a working distance (WD) between an electron beam column and a sample is narrowed as much as possible. However, the conventional composite charged particle beam apparatus needs to avoid interference between a stage on which the sample is placed and the electron beam column, and thus it is difficult to narrow the WD.

Also, in order to avoid interference between the stage and the electron beam column, reduction of the stage in size may be considered. In this case, the size of the sample that is possibly placed on the reduced stage is limited, so that an observation target portion is picked up from the sample placed on a large stage, and is transferred on a dedicated stage reduced in size, thereby acquiring an SEM image. In this case, since the large stage and the dedicated stage reduced in size differ in shape or capacity, the distribution of the electric field near the sample observation position is varied, requiring correction of the electric field. However, there is a limit in a range in which correction of the electric field is possible. When the correction range of the electric field is exceeded, detection efficiency of a secondary electron detector decreases and only an SEM image with low contrast is acquired.

Also, in the case of the conventional general composite charged particle beam apparatus, an observation angle (an incidence angle of an electron beam) of an electron beam column with respect to a sample cross section is usually an angle of 54°, and an acquired SEM image is an image contracted in the upward-downward direction. Due to this, in order to associate the aspect ratio with the actual sample, correction is performed to extend the SEM image in the vertical direction. An SEM image processed with software turns into an inaccurate image that does not accurately reflect the actual sample cross-section image.

The present invention has been made keeping in mind the above problems occurring in the related art, and the present invention is intended to provide a charged particle beam apparatus and a sample processing observation method, wherein without changing the size of the stage, it is possible to acquire an SEM image with high resolution by narrowing the distance between the electron beam column and the sample, and to acquire an SEM image facing the observation surface of the sample.

In order to solve the above problems, an aspect of exemplary embodiments of the present invention provides a charged particle beam apparatus, and a sample processing observation method as follows.

Specifically, a charged particle beam apparatus of the present invention includes: a focused ion beam column emitting a focused ion beam; an electron beam column emitting an electron beam; a stage on which a sample is placed; a sample piece support holding a sample piece, which is cut out from the sample, including an observation target portion, which is cut out from the sample; and a control device controlling operation of the focused ion beam column, the electron beam column, the stage, and the sample piece support, wherein the control device performs, when acquiring an SEM image of a cross section including the observation target portion of the sample, control to move the sample piece to a position that is closer to the electron beam column than to an intersection point of a beam optical axis of the focused ion beam and a beam optical axis of the electron beam.

Also, in the present invention, when forming the cross section with the focused ion beam, control to move the sample piece to the intersection point may be performed.

Also, in the present invention, in at least one case among a case when the cross section is irradiated with the focused ion beam such that processing of the cross section is performed and a case when the SEM image of the cross section comprising the observation target portion of the sample is acquired, performs control to move the stage to approach the sample piece.

A sample processing observation method of the present invention for processing a cross section including an observation target portion of a sample and for acquiring an SEM image thereof, by using a charged particle beam apparatus including: a focused ion beam column emitting a focused ion beam; an electron beam column emitting an electron beam; and a sample piece support holding a sample piece including the observation target portion, which is cut out from the sample, the sample processing observation method including: a sample piece formation process in which the sample is irradiated with the focused ion beam such that the sample piece is cut out from the sample; a cross-section processing process in which the sample piece is supported by the sample piece support and the cross section of the sample piece is irradiated with the focused ion beam such that processing of the cross section is performed; a sample piece approach movement process in which the sample piece is supported by the sample piece support and the sample piece is moved to a position that is closer to the electron beam column than an intersection point of a beam optical axis of the focused ion beam and a beam optical axis of the electron beam is; and an SEM image acquisition process in which the cross section of the sample piece is irradiated with the electron beam such that the SEM image of the cross section is acquired.

Also, in the present invention, the sample processing observation method may further include a sample piece angle adjustment process in which the sample piece is supported by the sample piece support and the cross section of the sample piece is tilted to be at a right angle to the beam optical axis of the electron beam.

Also, in the present invention, the sample processing observation method may further include a correction mark formation process in which a drift correction mark is formed on the sample piece.

Also, in the present invention, the multiple sample piece supports may be provided, and in the sample piece angle adjustment process, the sample piece may be transferred between the multiple sample piece supports.

Also, in the present invention, in at least one process among the cross-section processing process and the SEM image acquisition process, a stage on which the sample is placed may be moved to approach the sample piece.

Also, in the present invention, in the cross-section processing process, only a portion that locates inside of at least one part of a periphery portion of the sample piece may be made into a thin film.

Also, in the present invention, the processes from the cross-section processing process to the image acquisition process, including the sample piece approach movement process, may be repeated a predetermined number of times.

According to the present invention, it is possible to provide a charged particle beam apparatus and a sample processing observation method, wherein a distance between the electron beam column and the sample is narrowed without using a special stage, and an SEM image with high resolution is easily acquired.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
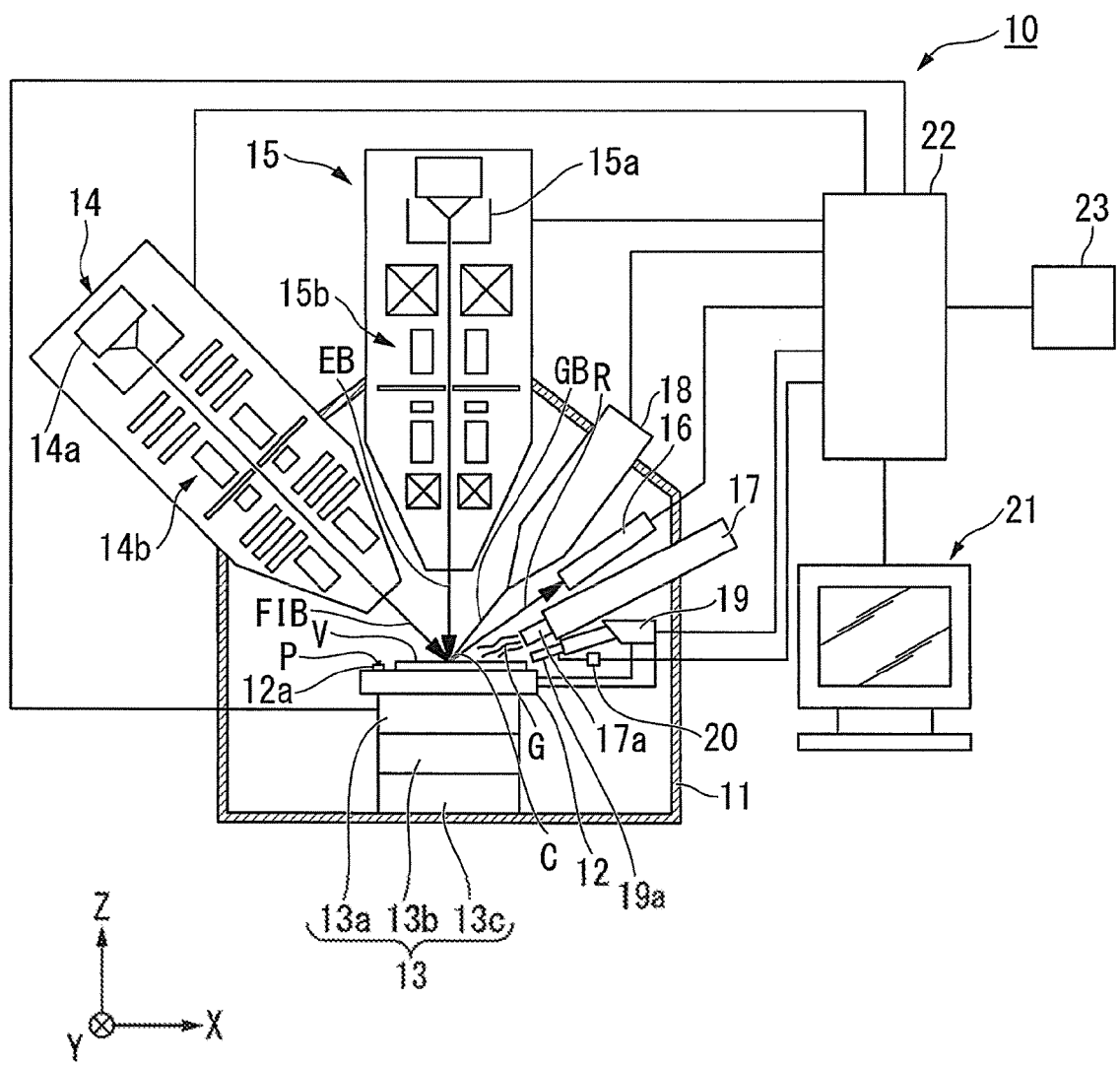
FIG. 1 is a diagram illustrating an example of a configuration of a charged particle beam apparatus according to the present invention.

Hereinafter, a charged particle beam apparatus and a sample processing observation method, which are exemplary embodiments of the present invention, will be described with reference to the accompanying drawings. Respective exemplary embodiments described below are specific examples for easily understanding the scope of the present invention and do not limit the present invention unless specified otherwise. In addition, in the drawings used in the following description, major components may be enlarged and illustrated in order to make characteristics of the present invention easier to understand, and a dimensional ratio of each component may not be the same as that of the actual one.

(Charged Particle Beam Apparatus)

FIG. 1 is a diagram illustrating a configuration of a charged particle beam apparatus according to an exemplary embodiment of the present invention.

The charged particle beam apparatus (composite charged particle beam apparatus) 10 according to the exemplary embodiment of the present invention includes, as shown in FIG. 1: a sample chamber 11 where the sample chamber's interior can be maintained at a vacuum state; a stage 12, in the sample chamber 11, fixing a sample holder P for holding a sample V in bulk; and a stage driving unit 13 driving the stage 12.

The charged particle beam apparatus 10 includes a focused ion beam column 14 irradiating, with a charged particle beam, for example, a focused ion beam (FIB), an irradiation target within a predetermined irradiation region (namely, a scanning range) inside the sample chamber 11. In this exemplary embodiment, a gallium ion beam is used as the focused ion beam (FIB).

The charged particle beam apparatus 10 includes an electron beam column 15 irradiating, with an electron beam (EB), the irradiation target within the predetermined irradiation region inside the sample chamber 11.

The charged particle beam apparatus 10 includes a detector 16 detecting secondary charged particles R (secondary electrons and secondary ions) that are generated from the irradiation target due to irradiation with the focused ion beam (FIB) or electron beam (EB).

The charged particle beam apparatus 10 includes a gas ion beam column 18 irradiating, with a gas ion beam (GB) which is a charged particle beam, the irradiation target within the predetermined irradiation region inside the sample chamber 11. In this exemplary embodiment, an argon ion beam is used as the gas ion beam (GB).

The focused ion beam column 14, the electron beam column 15, and the gas ion beam column 18 are arranged in such a manner that the respective beam irradiation axes intersect at an intersection point C which is one substantive point on the stage 12. That is, in this exemplary embodiment, when the sample chamber 11 is viewed from the side, the electron beam column 15 is placed in the vertical direction and the focused ion beam column 14 and the gas ion beam column 18 are placed in directions tilted, for example, at angles of 60° and 45° with respect to the vertical direction, respectively. Due to this placement layout, when the sample chamber 11 is viewed from the side, the beam irradiation axis of the gas ion beam (GB) is in a direction in a manner that is intersected, for example, at a right angle with the beam irradiation axis of the focused ion beam (FIB) from the focused ion beam column 14.

The charged particle beam apparatus 10 includes a gas supply unit 17 supplying gas G onto a surface of the irradiation target. The gas supply unit 17 is provided with a nozzle 17a of which the outer diameter is about 200 µm, specifically.

The charged particle beam apparatus 10 includes a sample piece support 19 that is composed of a needle 19a taking out a sample piece S from the sample V fixed on the stage 12 and holding the sample piece S, and of a needle driving unit 19b driving the needle 19a to move and rotate the sample piece S.

Also, the charged particle beam apparatus 10 includes an absorption current detector 20 detecting an introduction current (also called an absorption current), introduced into the needle 19a, of the charged particle beam, and transmitting an introduction current signal to a computer for imaging.

In this exemplary embodiment, only one sample piece support 19 is provided, but multiple sample piece supports 19 may be provided. For example, in the case where two sample piece supports 19 are provided, the sample piece supports 19 may be arranged to face each other at an angle of 180° around the horizontal circumference, or may be arranged at an angle of 90° with each other.

The charged particle beam apparatus 10 includes a display device 21 displaying image data, and the like, based on the secondary charged particles R detected by the detector 16, and also includes a computer (control device) 22, and an input device 23. Further, the irradiation target of the focused ion beam column 14 and the electron beam column 15 is the sample V fixed on the stage 12, the sample piece S, or the like.

The charged particle beam apparatus 10 emits the charged particle beam to scan and irradiate the surface of the irradiation target, such that it is possible to perform imaging of an irradiated part, various types of processing (excavating, trimming processing, and the like) by sputtering, forming of a deposition film, or the like. The charged particle beam apparatus 10 possibly performs processing of forming a micro sample piece (for example, a lamella, a needle-shaped sample, or the like), which is used for observation with the TEM, from the sample piece S cut out from the sample V, or of forming a sample piece for analysis with the electron beam.

Holding the sample piece S cut out from the sample V with a front end of the needle 19a of the sample piece support 19, the charged particle beam apparatus 10 may emit the focused ion beam (FIB) or the gas ion beam (GB) to the sample piece S, and may perform processing on the cross section including an observation target portion of the sample piece S.

Also, holding the sample piece S with the front end of the needle 19a of the sample piece support 19, the charged particle beam apparatus 10 may emit the electron beam EB to the cross section of the sample piece S, and may cause the detector 16 to detect the secondary charged particles R (secondary electrons and secondary ions) generated from the cross section of the sample piece S, thereby acquiring an SEM image of the cross section of the sample piece S.

The absorption current detector 20 including a pre-amplifier amplifies the introduction current at the needle, and transmits the resulting current to the computer 22. By the introduction current at the needle detected by the absorption current detector 20 and a signal synchronized with scanning of the charged particle beam, it is possible to display a absorption current image of a needle shape on the display device 21, and to specify the needle shape or the position of the front end.

The sample chamber 11 is configured in such a manner that exhausting is performed by an exhaust device (not shown) until the sample chamber's interior reaches a desired vacuum state, and that the desired vacuum state is maintained.

The stage 12 holds the sample V. The stage 12 includes a holder fixing plate 12a fixing the sample holder P that holds the sample V. The holder fixing plate 12a may have a structure in which multiple sample holders P may be provided.

Being connected with the stage 12, the stage driving unit 13 is housed inside the sample chamber 11. The stage driving unit 13 displaces the stage 12 with respect to a predetermined axis according to a control signal output from the computer (control device) 22. The stage driving unit 13 includes a moving unit 13a moving the stage 12 parallel to the X-axis and the Y-axis, which are at least parallel to a horizontal plane and perpendicular to each other, and to the Z-axis in the vertical direction perpendicular to the X-axis and the Y-axis. The stage driving unit 13 includes a tilt unit 13b causing the stage 12 to be tilted around the X-axis or the Y-axis, and a rotating unit 13c rotating the stage 12 around the Z-axis.

The focused ion beam column 14 is fixed to the sample chamber 11 in such a manner that a beam emitting portion (not shown) inside the sample chamber 11 faces the stage 12 in a tilt direction tilted to be at a predetermined angle (for example, an angle of) 60° with respect to the vertical direction of the stage 12 within the irradiation region and the optical axis is parallel to the tilt direction. Due to this, the irradiation target, such as the sample V placed on the stage 12, the sample piece S, the needle 19a present within the irradiation region, or the like, is possibly irradiated with the focused ion beam emitted downward in the tilt direction.

The focused ion beam column 14 includes an ion source 14a generating ions, and ion optics 14b focusing and deflecting ions moved out of the ion source 14a. The ion source 14a and the ion optics 14b are controlled according to the control signal output from the computer (control device) 22. The irradiation position, the irradiation condition, and the like of the charged particle beam are controlled by the computer 22.

The ion source 14a is, for example, a liquid metal ion source, which uses liquid gallium, or the like, a plasma ion source, a gas field ion source, or the like. The ion optics 14b includes, for example, a first electrostatic lens, such as a condenser lens, or the like; an electrostatic deflector; and a second electrostatic lens, such as an objective lens, or the like. When the plasma ion source is used as the ion source 14a, fast processing by a high current beam is realized and this is suitable for extraction of a large-sized sample piece S. For example, by using argon ions as the gas field ion source, it is possible to emit the argon ion beam from the focused ion beam column 14.

The electron beam column 15 is fixed to the sample chamber 11 in such a manner that a beam emitting portion (not shown) inside the sample chamber 11 faces the stage 12 at a position in the vertical direction above the stage 12 within the irradiation region and the optical axis is parallel to the vertical direction. Due to this, the irradiation target, such as the sample V fixed on the stage 12, the sample piece S, the needle 19a present within the irradiation region, or the like, is possibly irradiated with the electron beam emitted downward in the vertical direction.

The electron beam column 15 includes an electron source 15a generating electrons, and electron optics 15b focusing and deflecting electrons emitted from the electron source 15a. The electron source 15a and the electron optics 15b are controlled according to the control signal output from the computer (control device) 22. The irradiation position, the irradiation condition, and the like of the electron beam are controlled by the computer 22. The electron optics 15b includes, for example, an electron lens, a deflector, or the like.

Further, the electron beam column 15 and the focused ion beam column 14 may be exchangeably arranged so that the electron beam column 15 may be placed in the tilt direction tilted to be at a predetermined angle with respect to the vertical direction and the focused ion beam column 14 may be placed in the vertical direction.

The gas ion beam column 18 emits, for example, the gas ion beam (GB), such as an argon ion beam, or the like. The gas ion beam column 18 may ionize argon gas for emission with a low acceleration voltage of about 1 kV. The gas ion beam (GB) has low focusing, compared with the focused ion beam (FIB), so that the etching rate with respect to the sample piece S or to the micro sample piece Q is low. Therefore, this is suitable for precise finishing processing of the sample piece S or the micro sample piece Q.

The detector 16 detects the intensity (namely, the amount of the secondary charged particles) of the secondary charged particles R (secondary electrons and secondary ions) radiated from the irradiation target when the irradiation target, such as the sample V, the sample piece S, the needle 19a, or the like, is irradiated with the charged particle beam or with the electron beam; and outputs information on the amount of the detected secondary charged particles R. The detector 16 is fixed to the sample chamber 11 in such a manner as to be placed at a position where the amount of the secondary charged particles R is possibly detected inside the sample chamber 11, for example, an upper position tilted with respect to the irradiation target, such as the sample V, the sample piece S, or the like within the irradiation region.

The gas supply unit 17 is fixed to the sample chamber 11, and includes a gas spray part (also called a nozzle) placed to face the stage 12 inside the sample chamber 11. The gas supply unit 17 possibly supplies, to the sample V and the sample piece S, etching gas for selectively stimulating etching of the sample V and the sample piece S by the focused ion beam (FIB) depending on the materials thereof, and deposition gas for forming a deposition film on the surface of the sample V and the surface of the sample piece S by a deposit, such as metal, an insulator, or the like.

Being connected with the needle 19a, the needle driving unit 19b of the sample piece support 19 is housed inside the sample chamber 11. The needle driving unit 19b displaces the needle 19a according to the control signal output from the computer (control device) 22. The needle driving unit 19b is provided in a manner that integrates with the stage 12. For example, when the stage 12 is rotated around a tilt shaft (specifically, the X-axis or the Y-axis) of the tilt unit 13b, the needle driving unit 19b moves with the stage 12 in an integrated manner.

The needle driving unit 19b includes a moving unit (not shown) moving the needle 19a parallel to each of the three-dimensional coordinate axes, and a rotating unit (not shown) rotating the needle 19a around the central axis of the needle 19a. Further, these three-dimensional coordinate axes are a 3-axis orthogonal coordinate system, which are independent of a 3-axis orthogonal coordinate system of the sample stage, based on two-dimensional coordinate axes parallel to the surface of the stage 12. When the surface of the stage 12 is in a tilt state and a rotation state, the coordinate system is rotated in a tilted manner.

The computer (control device) 22 controls at least the stage driving unit 13, the focused ion beam column 14, the electron beam column 15, the gas supply unit 17, and the needle driving unit 19b.

Further, the computer 22 is placed outside the sample chamber 11 and is connected to the display device 21 and to the input device 23, such as a mouse, a keyboard, or the like, for outputting a signal resulting from input operation of an operator. The computer 22 controls overall operation of the charged particle beam apparatus 10 by a signal output from the input device 23, a signal generated by preset automatic operation control processing, or the like.

The computer 22 converts the amount of the secondary charged particles R detected by the detector 16 while the irradiation position for the charged particle beam is scanned, into a luminance signal corresponding to the irradiation position, and generates image data representing the shape of the irradiation target by using two-dimensional position distribution of the amount of the detected secondary charged particles R.

The computer 22 controls the display device 21 to display the generated image data as well as a screen for executing operations, such as zoom-in, zoom-out, shift, rotation, and the like of each image data. The computer 22 controls the display device 21 to display a screen for performing various settings, such as mode selection, processing setting, and the like in automatic sequence control.

Sample Processing Observation Method: First Exemplary Embodiment

A sample processing observation method according to a first exemplary embodiment of the present invention using the charged particle beam apparatus 10 of the above-described configuration will be described with reference to FIGS. 1 to 4.

Figure 2:
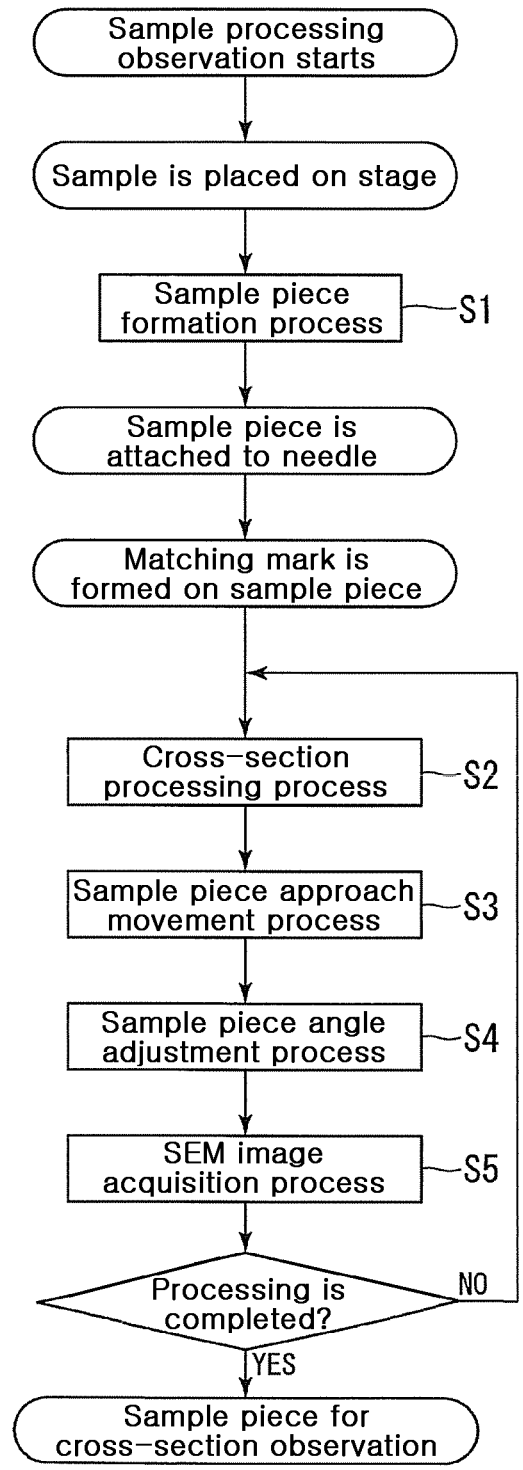
FIG. 2 is a flowchart illustrating a sample processing observation method according to the present invention step by step.

FIG. 2 is a flowchart illustrating a sample processing observation method according to the present invention step by step.

When forming, by the sample processing observation method of the present invention, an observation cross section of the sample piece S including the observation target portion, first, the sample V in bulk including the observation target portion is set to the sample holder P and is then placed on the stage 12. Examples of the sample V including the observation target portion include, for example, a semiconductor chip in which a fine integrated circuit is formed, and the like.

Next, from the sample V placed on the stage 12, a small region including the observation target portion is cut out to prepare the sample piece S (a sample piece formation process S1). In the sample piece formation process S1, the sample V is irradiated by the focused ion beam (FIB), for example, a gallium ion beam emitted from the focused ion beam column 14. Herein, along the outer edge of the small region including the observation target portion preset in the sample V, the focused ion beam (FIB) is emitted. Due to this, the sample piece S is acquired by cutting the small region including the observation target portion out from the sample V. The sample piece S is, for example, formed in the shape of a rectangular thin plate.

Next, the needle driving unit 19b of the sample piece support 19 is operated to cause the front end of the needle 19a to be in contact with the outside of the sample piece S, for example, the side perpendicular to the processed surface (cross section) in which the observation cross section is formed by the SEM.

Further, supplying deposition gas, for example, carbon-based gas from the nozzle 17a of the gas supply unit 17 toward a portion at which the needle 19a is in contact with the sample piece S, this portion is irradiated with the focused ion beam (FIB) from the focused ion beam column 14. Due to this, the deposition film is formed on the portion at which the front end of the needle 19a is in contact with the sample piece S. Due to this deposition film, the front end of the needle 19a is attached to the sample piece S, and the sample piece S is supported by the needle 19a.

Next, a matching mark (one-point drift correction mark) is formed with respect to the sample piece S by the focused ion beam (FIB). The matching mark is formed at a position that does not disappear during a cross-section processing process S2, which is the next process. Next, a slice processing range which is the processed surface (cross section) is set in the sample piece S. Herein, a drift correction function is set.

Figure 3A:
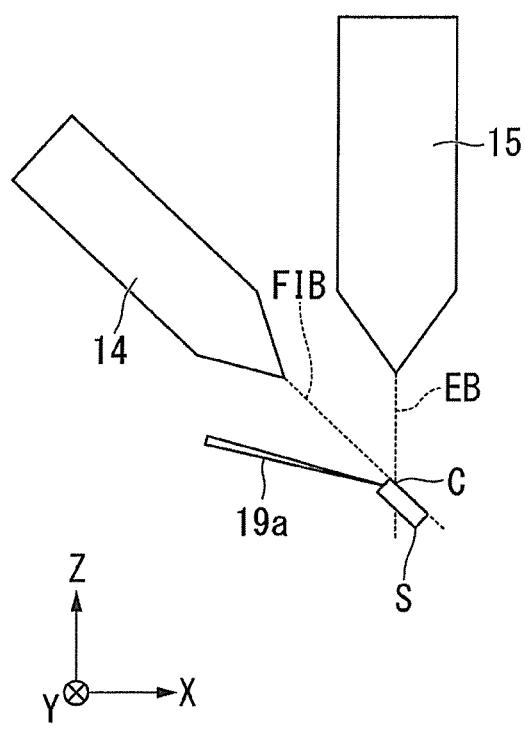
FIGS. 3A to 3C are diagrams illustrating a first exemplary embodiment.

Next, as shown in FIG. 3A, the needle 19a supporting the sample piece S is moved in such a manner that the processed surface of the sample piece S corresponds with the intersection point C in which the beam irradiation axes intersect at one point. For example, the processed surface (cross section) of the sample piece S is irradiated with the focused ion beam (FIB) emitted from the focused ion beam column 14 in a direction parallel to the processed surface, so that the processed surface of the sample piece S is cut to a predetermined depth (the cross-section processing process S2).

Figure 3B:
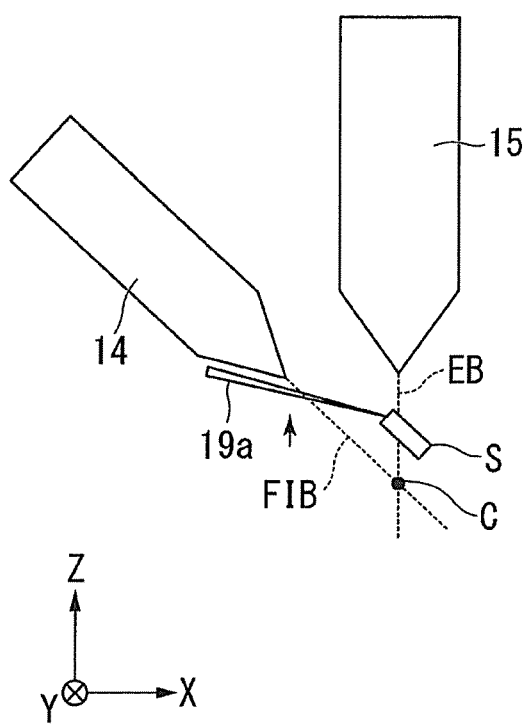

Next, as shown in FIG. 3B, holding the sample piece S on the needle 19a, the needle 19a is operated through the needle driving unit 19b, and the sample piece S is moved (in the Z direction shown in FIG. 3B) so that the processed surface of the sample piece S is closer to an emission end of the electron beam column 15 than the intersection point C is (a sample piece approach movement process S3). That is, the sample piece S is moved to a position where the working distance of the electron beam column 15 with respect to the processed surface of the sample piece S is small compared with the intersection point C.

Figure 3C:
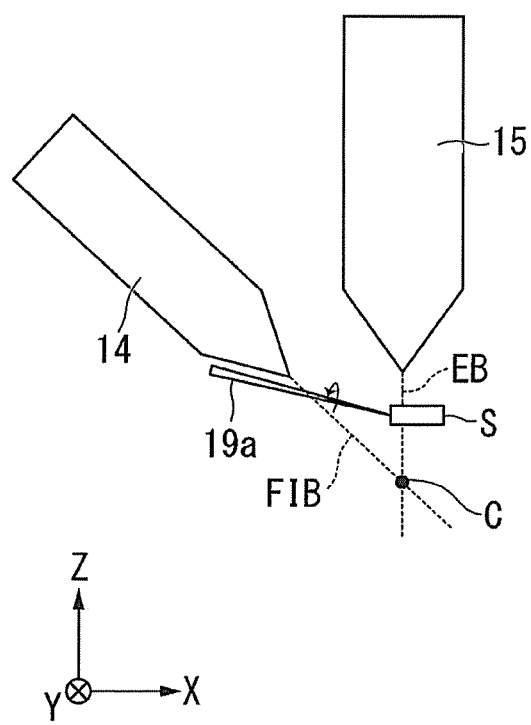

Next, as shown in FIG. 3C, the needle 19a is rotated through the needle driving unit 19b so that the processed surface (cross section) of the sample piece S is tilted to be at a right angle to the beam optical axis of the electron beam column 15 (a sample piece angle adjustment process S4). Further, herein, in the case where the processed surface (cross section) of the sample piece S is at an almost right angle to the beam optical axis of the electron beam column 15 in a range of 90°±5°, when acquiring the SEM image, which will be described later, the effect almost equivalent to that of the perfect right angle (90°) is obtained.

Next, the sample piece S of which the processed surface (cross section) is at a right angle to the beam optical axis of the electron beam column 15 is irradiated with the electron beam (EB) from the electron beam column 15. Herein, by going through the sample piece angle adjustment process S4 before the processes, the electron beam (EB) strikes the processed surface (cross section) of the sample piece S at an almost right angle. Further, the secondary electrons (secondary charged particles) coming from the processed surface (cross section) of the sample piece S are detected by the detector 16, and on the basis of the output signal of the detector 16, the SEM image of the processed surface (cross section) is formed by the computer 22, and is then displayed on the display device 21 (a SEM image acquisition process S5). Furthermore, in the SEM image acquisition process S5, matching is performed on the edge portion of the sample piece S, or the like, and the center position at the time of SEM image acquisition is automatically recognized.

Compared with the SEM image acquired in a condition where the processed surface (cross section) of the sample piece S is positioned at the intersection point C, as in the related art, the SEM image of the processed surface (cross section) of the sample piece S which has been subjected to the sample piece approach movement process S3 as described above is an SEM image acquired at the position where the position of the processed surface (cross section) of the sample piece S is much closer to the electron beam column 15, so that the shape of the processed surface (cross section) is more sharp and even if enlargement magnification is increased, the details are possibly seen sharply. Therefore, even if the sample piece S has an observation target of which the structure is fine and complicated, it is possible to accurately understand the state of the processed surface (cross section).

Further, by the sample piece angle adjustment process S4, the sample piece S is moved (rotated) in such a manner that the processed surface (cross section) of the sample piece S is at a right angle to the beam optical axis of the electron beam column 15. Thus, the SEM image of the processed surface (cross section) acquired in the SEM image acquisition process S5 rarely has contraction in the upward-downward direction, compared with the SEM image acquired in a state where the processed surface is at an angle (for example, an angle of 54°) tilted more than a right angle to the beam optical axis of the electron beam column 15, as in the related art. Due to this, without processing the acquired SEM image with software, it is possible to acquire the SEM image that accurately reflects the shape of the processed surface (cross section) with no deformation.

Afterward, the shape of the processed surface (cross section) acquired in the SEM image acquisition process S5 is checked, and the processes from the cross-section processing process S2 to the SEM image acquisition process S5 are repeated until the desired processed surface (cross section) is acquired. When the sample piece S returns to the processing position where processing by the focused ion beam (FIB) takes place, recognition of the drift correction mark is performed.

Further, the processes from the cross-section processing process S2 to the SEM image acquisition process S5 may be repeated a predetermined desired number of times so that SEM images of continuous multiple cross sections in a particular region of the sample piece S are acquired and it is possible to generate a stereoscopic image of the particular region of the sample piece S. That is, at least, the following processes are repeatedly performed: in the cross-section processing process S2, the sample piece S is moved to the intersection point C to perform slice processing on the processed surface; in the sample piece approach movement process S3, the sample piece S is moved to be closer to the emission end of the electron beam column 15 than the intersection point C is; and in the SEM image acquisition process S5, the SEM image is acquired. The computer 22 controls the needle driving unit 19b in such a manner that the sample piece S comes and goes between the processing position and the observation position. Due to this, it is possible to perform continuous cross-section processing observation on the sample piece. Also, on the basis of the information acquired through cross-section processing observation, it is possible to generate a stereoscopic image of the region on which cross-section processing observation is performed.

In the case where the processes are performed from the SEM image acquisition process S5 to the cross-section processing process S2, fixing the sample piece S on the needle 19a, a reverse rotation operation is performed in the sample piece angle adjustment process S4, and subsequently a reverse movement operation of the sample piece approach movement process S3 is performed.

As described above, according to the sample processing observation method of the present invention, it is possible to perform the processing of the processed surface (cross section) of the sample piece S and the observation using the SEM image while the sample piece S is fixed on the needle 19a. Therefore, it is possible to observe the sample piece S, for example, without moving the sample piece S to the dedicated stage, resulting in considerable reduction in working hours.

Also, since it is possible to perform observation using the SEM image while the sample piece S is fixed on the needle 19a, the change in the distribution of the electric field near the observation position is restrained to be small, compared with the case where the dedicated stage of which the volume is larger than that of the needle 19a is used. Therefore, it is possible to prevent the contrast of the acquired SEM image from being lowered, and to acquire a sharp SEM image with high contrast.

Figure 4:
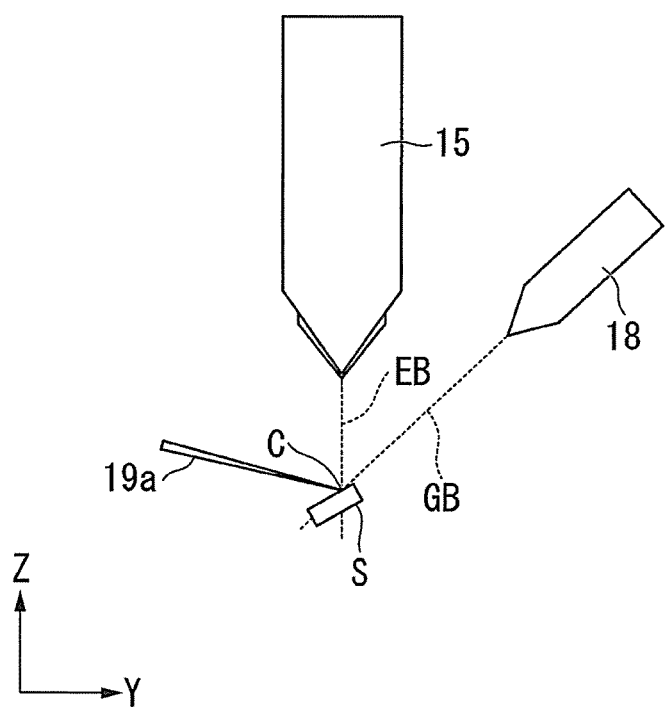
FIG. 4 is a diagram illustrating a modification of the first exemplary embodiment.

As a modification of the sample processing observation method of the first exemplary embodiment, it is preferable that after the cross-section processing process S2 using the focused ion beam (FIB), finishing processing of the processed surface (cross section) of the sample piece S is performed by emitting the gas ion beam (GB) from the gas ion beam column 18, for example, an argon ion beam (refer to FIG. 4).

The gas ion beam column 18 may ionize argon gas for emission with, for example, a low acceleration voltage of about 1.0 keV. The argon ion beam has low focusing, compared with the focused ion beam (FIB), such as the gallium ion beam, or the like, so that the etching rate with respect to the processed surface (cross section) of the sample piece S is low. Therefore, the argon ion beam is suitable for precise finishing processing after processing is performed with the gallium ion beam on the processed surface (cross section) of the sample piece S.

As described above, by performing finishing processing with the gas ion beam (GB) on the processed surface (cross section) of the sample piece S, the SEM image of the processed surface (cross section) acquired in the SEM image acquisition process S5 is possibly made sharp.

Sample Processing Observation Method: Second Exemplary Embodiment

For enhancing resolution of the SEM image, in the case of using a semi-in-lens type of the electron beam column 15 that forms an electron lens between the electron beam column 15 and the sample piece S, the magnetic field of the electron lens occurs outside the electron beam column 15. Therefore, in the cross-section processing process S2, when the sample piece S is processed with the focused ion beam (FIB), particularly, the focused ion beam (FIB) with low acceleration may have the bent beam trajectory or the deformed beam shape due to the magnetic field of the electron lens of the electron beam column 15.

Figure 5A:
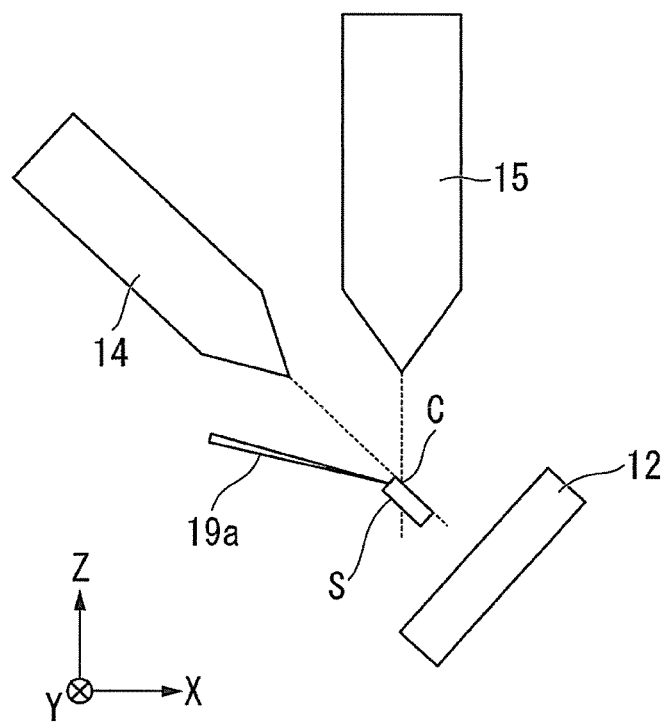
FIGS. 5A and 5B are diagrams illustrating a second exemplary embodiment.

Because of this, according to the second exemplary embodiment, in the cross-section processing process S2, the stage driving unit 13 is operated to cause the stage 12 to approach the sample piece S that the needle 19a holds (refer to FIG. 5A). The stage 12 is placed in such a manner that the magnetic field is substantially symmetrical with respect to the beam trajectory of the focused ion beam (FIB).

Figure 5B:
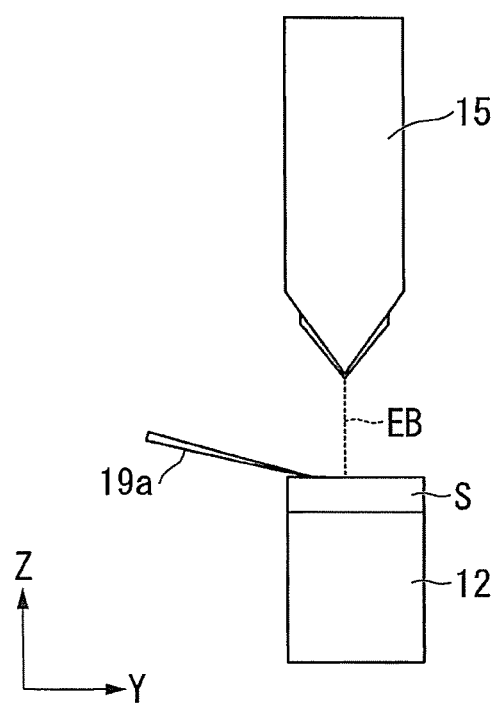

Similarly, also in the SEM image acquisition process S5, the stage driving unit 13 is operated to cause the stage 12 to approach the sample piece S that the needle 19a holds (refer to FIG. 5B). Due to this, it is possible to control the magnetic field to have appropriate distribution with respect to the electron beam (EB). The stage 12 is placed in such a manner that the magnetic field is substantially symmetrical with respect to the beam trajectory of the electron beam (EB).

Sample Processing Observation Method: Third Exemplary Embodiment

Figure 6A:
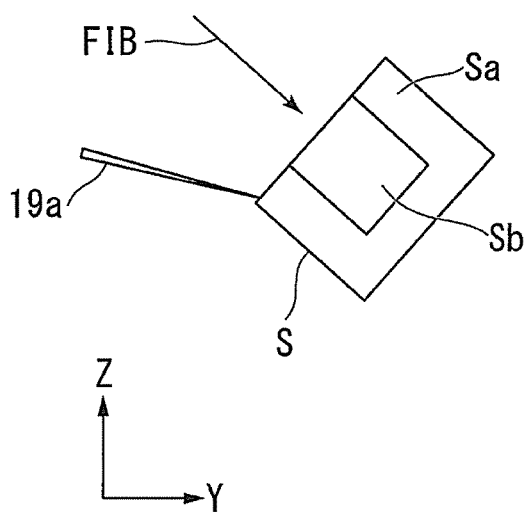
FIGS. 6A and 6B are diagrams illustrating a third exemplary embodiment.

According to the third exemplary embodiment, in the cross-section processing process S2, frame processing is performed on the sample piece S. That is, as shown in FIG. 6A, one side of the sample piece S is irradiated with the focused ion beam (FIB) at a first irradiation angle so that the three sides of the rectangular processed surface (cross section) of the sample piece S, which are periphery portions, are remained in the shape of a frame with a predetermined width (a frame part Sa), and the inside thereof is processed in the form of a thin film (a thin film part Sb).

Figure 6B:
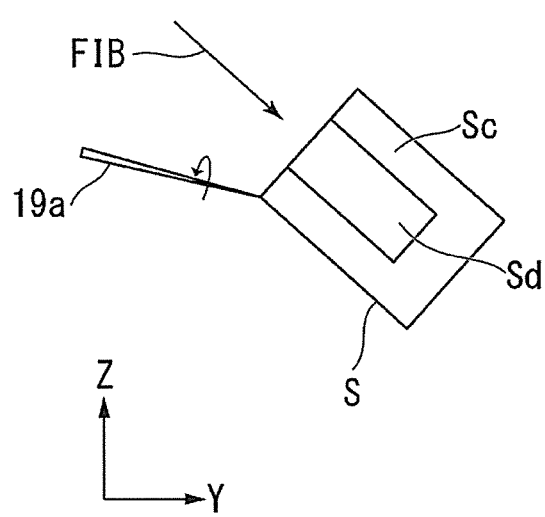

Next, as shown in FIG. 6B, the needle 19a is rotated to reverse the front and the back of the sample piece S, and the focused ion beam (FIB) is emitted at a second irradiation angle so that the three sides of the rectangular processed surface (cross section) of the sample piece S remain in the shape of a frame with a predetermined width (a frame part Sc), and the inside thereof is processed in the form of a thin film (a thin film part Sd) (refer to FIG. 6B).

According to the third exemplary embodiment, only a part of the sample piece S is processed in the form of a thin film, and the periphery is remained as the frame part that is not processed in the form of a thin film, thereby maintaining the strength of the sample of which a part is processed in the form of a thin film. Further, by performing frame processing on the front and the back of the sample piece S in different directions, it is possible to process the entire periphery of the thin par in the shape of a frame, so that the strength of the sample is possibly maintained. Also, it is possible to restrain the stripes caused by the curtaining effect from being formed on the sample piece.

Sample Processing Observation Method: Fourth Exemplary Embodiment

Figure 7A:
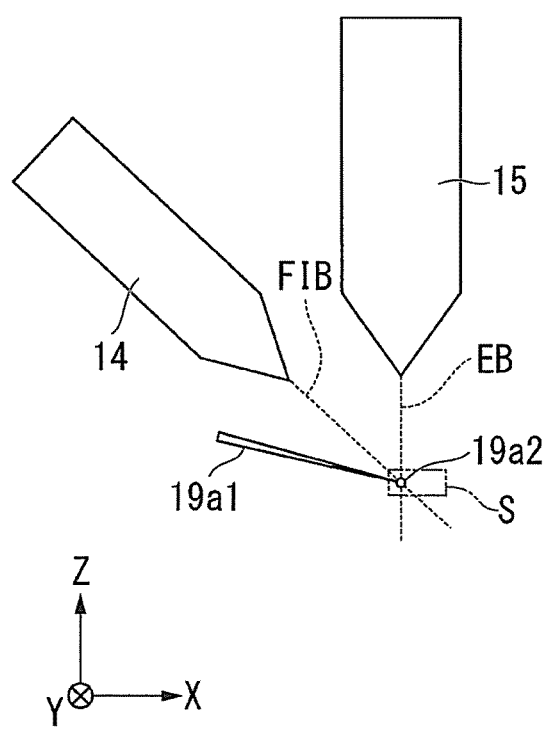
FIGS. 7A and 7B are diagrams illustrating a fourth exemplary embodiment.
Figure 7B:
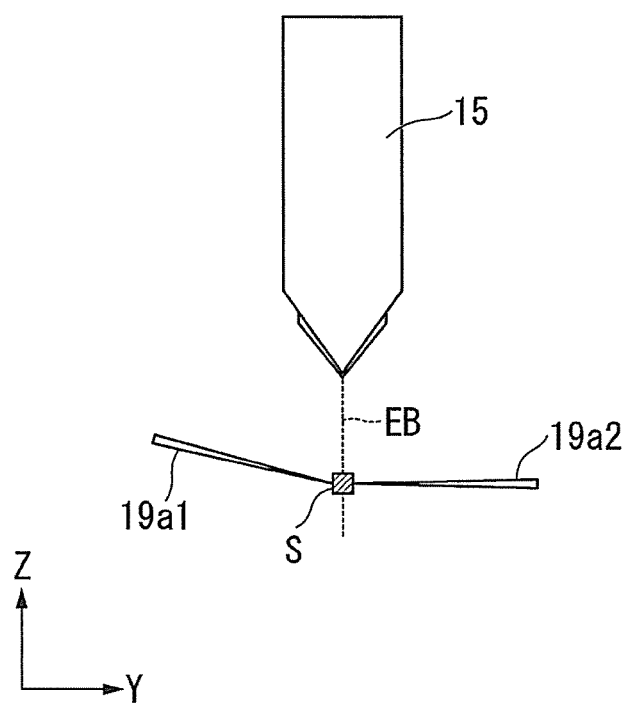

The fourth exemplary embodiment is an example of using the charged particle beam apparatus 10 having two sample piece supports 19 provided with two needles 19a1 and 19a2 spaced apart from each other (refer to FIGS. 7A and 7B). First, a first needle 19a1 holds the sample piece S.

Then, the sample piece S is transferred to a second needle 19a2, and the second needle 19a2 is rotated, thereby changing the incidence angle of the focused ion beam (FIB) to the sample piece S (refer to FIG. 7A). As shown in FIG. 7B, the second needle 19a2 is placed in such a manner as to be parallel to the direction of the normal to the surface defined by the beam optical axis of the electron beam (EB) and the beam optical axis of the focused ion beam (FIB).

Figure 8A:
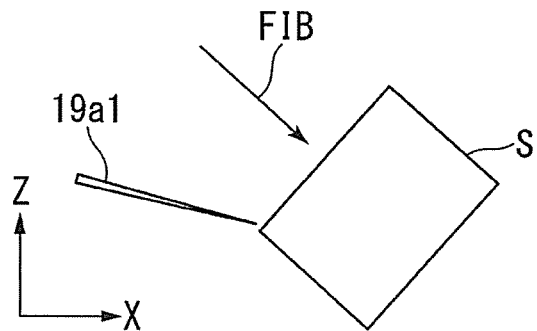
FIGS. 8A to 8D are diagrams illustrating the fourth exemplary embodiment.
Figure 8B:
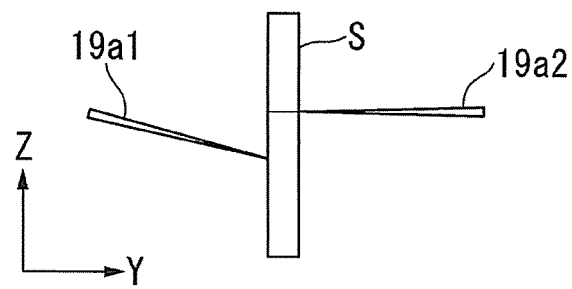
Figure 8C:
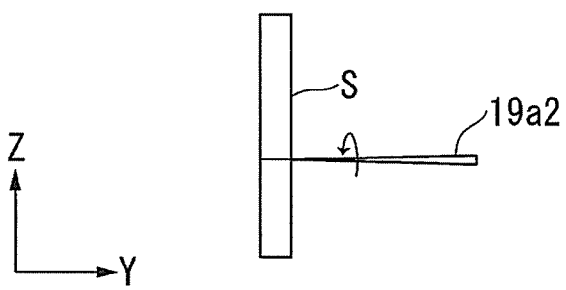
Figure 8D:
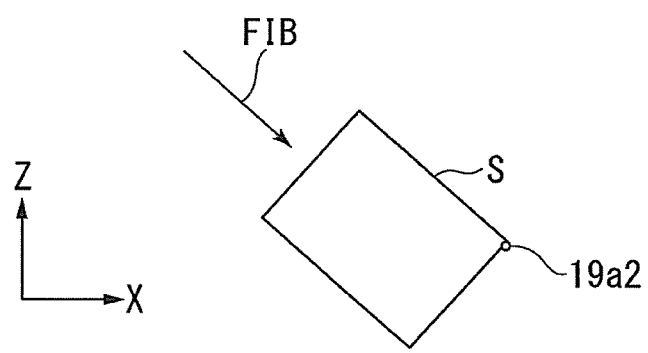

First, supporting the sample piece S with the first needle 19a1, FIB processing is performed by emitting the focused ion beam (FIB) at a first incidence angle (refer to FIG. 8A). Next, the second needle 19a2 is connected to the sample piece S (refer to FIG. 8B). Next, the sample piece S is separated from the first needle 19a1, and the second needle 19a2 is rotated (refer to FIG. 8C). Then, FIB processing is performed by emitting the focused ion beam (FIB) at the first incidence angle (refer to FIG. 8D).

According to the sample processing observation method of the fourth exemplary embodiment, since the second needle 19a2 is possibly rotated around the vertical direction with respect to the beam optical axis of the focused ion beam (FIB), it is easy to adjust the incidence angle of the focused ion beam (FIB) with respect to the sample piece S, thereby enhancing the ease of processing the sample piece S.

Although the exemplary embodiments of the present invention have been described, these exemplary embodiments are presented as examples and are not intended to limit the scope of the present invention. These exemplary embodiments can be practiced in other various modes and can be omitted, substituted or modified variously without departing from the gist of the present invention. These exemplary embodiments and modifications thereof are included in the scope or gist of the invention and also included in the scope of the inventions recited in the claims and equivalents thereof.

What is claimed is:

1. A charged particle beam apparatus comprising: a focused ion beam column emitting a focused ion beam; an electron beam column emitting an electron beam; a stage on which a sample is placed; a sample piece support holding a sample piece, which is cut out from the sample, including an observation target portion; and a control device controlling operation of the focused ion beam column, the electron beam column, the stage, and the sample piece support,
    wherein the control device performs, when acquiring an SEM image of a cross section including the observation target portion of the sample, control to move the sample piece to a position that is closer to the electron beam column than to an intersection point of a beam optical axis of the focused ion beam and a beam optical axis of the electron beam.

2. The charged particle beam apparatus of claim 1, wherein the control device performs, when forming the cross section with the focused ion beam, control to move the sample piece to the intersection point.

3. The charged particle beam apparatus of claim 1, wherein the control device, in at least one case among a case when the cross section is irradiated with the focused ion beam such that processing of the cross section is performed and a case when the SEM image of the cross section comprising the observation target portion of the sample is acquired, performs control to move the stage to approach the sample piece.

4. A sample processing observation method for processing a cross section including an observation target portion of the sample and for acquiring a SEM image thereof, by using a charged particle beam apparatus including: a focused ion beam column emitting a focused ion beam; an electron beam column emitting an electron beam; and a sample piece support holding a sample piece which is cut out from the sample, including the observation target portion, the sample processing observation method comprising:
    a sample piece formation process in which the sample is irradiated with the focused ion beam such that the sample piece is cut out from the sample;
    a cross-section processing process in which the sample piece is supported by the sample piece support and the cross section of the sample piece is irradiated with the focused ion beam such that processing of the cross section is performed;
    a sample piece approach movement process in which the sample piece is supported by the sample piece support and the sample piece is moved to a position that is closer to the electron beam column than an intersection point of a beam optical axis of the focused ion beam and a beam optical axis of the electron beam is; and
    an SEM image acquisition process in which the cross section of the sample piece is irradiated with the electron beam such that the SEM image of the cross section is acquired.

5. The sample processing observation method of claim 4, further comprising:
    a sample piece angle adjustment process in which the sample piece is supported by the sample piece support and the cross section of the sample piece is tilted to be at a right angle to the beam optical axis of the electron beam.

6. The sample processing observation method of claim 4, further comprising:
    a correction mark formation process in which a drift correction mark is formed on the sample piece.

7. The sample processing observation method of claim 5, wherein the sample piece angle adjustment process performs transfers of the sample piece between a plurality of sample piece supports.

8. The sample processing observation method of claim 4, wherein in at least one process among the cross-section processing process and the SEM image acquisition process, a stage on which the sample is placed is moved to approach the sample piece.

9. The sample processing observation method of claim 4, wherein in the cross-section processing process, only a portion that locates inside of at least one part of a periphery portion of the sample piece is made into a thin film.

10. The sample processing observation method of claim 4, wherein the processes from the cross-section processing process to the image acquisition process, including the sample piece approach movement process, are repeated a predetermined number of times.

* * * * *